United States Patent
Lei et al.

(10) Patent No.: US 8,951,819 B2
(45) Date of Patent: Feb. 10, 2015

(54) WAFER DICING USING HYBRID SPLIT-BEAM LASER SCRIBING PROCESS WITH PLASMA ETCH

(75) Inventors: Wei-Sheng Lei, San Jose, CA (US); Brad Eaton, Menlo Park, CA (US); Madhava Rao Yalamanchili, Morgan Hill, CA (US); Saravjeet Singh, Santa Clara, CA (US); Ajay Kumar, Cupertino, CA (US); Aparna Iyer, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 13/180,021

(22) Filed: Jul. 11, 2011

(65) Prior Publication Data

US 2013/0017668 A1  Jan. 17, 2013

(51) Int. Cl.
*H01L 21/00* (2006.01)
*B23K 26/00* (2014.01)
*H01L 21/3065* (2006.01)
*H01L 21/78* (2006.01)
*H01L 21/67* (2006.01)

(52) U.S. Cl.
CPC ............ *H01L 21/3065* (2013.01); *H01L 21/78* (2013.01); *B23K 26/00* (2013.01); *H01L 21/67207* (2013.01)
USPC ........... 438/33; 438/53; 438/463; 219/121.68

(58) Field of Classification Search
USPC .......................... 438/33, 53, 463; 219/121.68
See application file for complete search history.

(56) References Cited

U.S. PATENT DOCUMENTS

| | | | |
|---|---|---|---|
| 4,049,944 A | 9/1977 | Garvin et al. | |
| 5,373,137 A | 12/1994 | McLaughlin | |
| 5,593,606 A | 1/1997 | Owen et al. | |
| 6,057,180 A | 5/2000 | Sun et al. | |
| 6,174,271 B1 | 1/2001 | Kosmowski | |
| 6,300,593 B1 * | 10/2001 | Powell | 219/121.68 |
| 6,306,731 B1 | 10/2001 | Igarashi et al. | |

(Continued)

FOREIGN PATENT DOCUMENTS

| JP | 9216085 | 8/1997 |
|---|---|---|
| JP | 10321908 | 12/1998 |

(Continued)

OTHER PUBLICATIONS van Borkulo, Jeroen, et al. "Enabling Technology in Thin Wafer Dicing," The Electrochemical Society, vol. 18, Issue 1, Packaging Technology, 2009, pp. 837-842.

(Continued)

*Primary Examiner* — Charles Garber
*Assistant Examiner* — Ron Pompey
(74) *Attorney, Agent, or Firm* — Blakely Sokoloff Taylor Zafman LLP (57) ABSTRACT

Methods of dicing semiconductor wafers, each wafer having a plurality of integrated circuits, are described. A method includes forming a mask above the semiconductor wafer. The mask is composed of a layer covering and protecting the integrated circuits. The mask is patterned with a split-beam laser scribing process to provide a patterned mask with gaps. The patterning exposes regions of the semiconductor wafer between the integrated circuits. The semiconductor wafer is then etched through the gaps in the patterned mask to singulate the integrated circuits.

12 Claims, 10 Drawing Sheets

(56) References Cited

U.S. PATENT DOCUMENTS

| | | |
|---|---|---|
| 6,407,363 B2 | 6/2002 | Dunsky et al. |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 * | 3/2011 | Arita et al. ............ 438/462 |
| 7,923,351 B2 | 4/2011 | Arita |
| 7,927,973 B2 | 4/2011 | Haji et al. |
| 2001/0035401 A1 * | 11/2001 | Manor ................ 219/121.72 |
| 2003/0162313 A1 | 8/2003 | Kim et al. |
| 2004/0080045 A1 | 4/2004 | Kimura et al. |
| 2004/0137700 A1 | 7/2004 | Sekiya |
| 2005/0035102 A1 * | 2/2005 | Amako et al. ........ 219/121.73 |
| 2006/0024924 A1 | 2/2006 | Haji et al. |
| 2006/0043535 A1 | 3/2006 | Hiatt |
| 2006/0086898 A1 * | 4/2006 | Cheng et al. ................ 250/236 |
| 2006/0146910 A1 * | 7/2006 | Koochesfahani et al. .... 374/161 |
| 2006/0205182 A1 | 9/2006 | Soejima |
| 2007/0099439 A1 * | 5/2007 | Van Borkulo et al. ........ 438/795 |
| 2009/0255911 A1 | 10/2009 | Krishnaswami et al. |
| 2010/0025287 A1 * | 2/2010 | Lin et al. .................... 206/711 |
| 2010/0120228 A1 * | 5/2010 | Saito et al. ................ 438/463 |
| 2011/0312157 A1 | 12/2011 | Lei et al. |
| 2012/0322242 A1 * | 12/2012 | Lei et al. ................ 438/462 |
| 2013/0045554 A1 * | 2/2013 | Yamazaki .................. 438/34 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2007-281526 | 10/2007 |
| WO | WO-03036712 | 5/2003 |
| WO | WO-03071591 | 5/2003 |

OTHER PUBLICATIONS

Linder, V., et al., "Water-Soluble Sacrificial Layers for Surface Micromachining", www.small-journal.com, 2005, 1, No. 7, 7 pgs.

Singh, Saravjeet, et al., "Apparatus and Methods for Dry Etch With Edge, Side and Back Protection", U.S. Appl. No. 61/491,693, filed May 31, 2011 24 pgs.

International Search Report and Written Opinion from PCT/US2012/045603 mailed Jan. 24, 2013, 10 pgs.

International Preliminary Report on Patentability dated Jan. 14, 2014, in International Patent Application No. PCT/US2012/045603, 7 pgs.

* cited by examiner

α  Separation angle
f  Focus length of lens
d  Spot distance according to α and f

WAFER DICING USING HYBRID SPLIT-BEAM LASER SCRIBING PROCESS WITH PLASMA ETCH

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits includes forming a mask above the semiconductor wafer, the mask composed of a layer covering and protecting the integrated circuits. The mask is then patterned with a split-beam laser scribing process to provide a patterned mask with gaps, exposing regions of the semiconductor wafer between the integrated circuits. The semiconductor wafer is then etched through the gaps in the patterned mask to singulate the integrated circuits.

In another embodiment, a method of dicing a semiconductor wafer having a plurality of integrated circuits includes forming a mask above the semiconductor wafer, the mask composed of a layer covering and protecting the integrated circuits. The mask is then patterned with a split-beam laser scribing process to provide a patterned mask with gaps, exposing regions of the semiconductor wafer between the integrated circuits. The split-beam laser scribing process includes splitting a laser beam into an M×N array of points, wherein both M and N are greater than 1. The integrated circuits are singulated through the gaps in the patterned mask.

In another embodiment, a system for dicing a semiconductor wafer includes a factory interface. A laser scribe apparatus is coupled with the factory interface and includes a laser coupled with a beam splitter. A plasma etch chamber is also coupled with the factory interface.

DETAILED DESCRIPTION

Methods of dicing semiconductor wafers, each wafer having a plurality of integrated circuits thereon, are described. In the following description, numerous specific details are set forth, such as split-beam laser scribing approaches and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In an embodiment of the present invention, a method and system for femtosecond laser scribing of wafers using a split beam array is provided. In one such embodiment, clean laser scribing is achieved while required process throughput is maintained.

Polymers, dielectrics and metals are typically more difficult to etch away as compared with silicon, e.g., from a silicon substrate or a thinned silicon substrate. Over-melted silicon has also been found to be more difficult to etch than regular silicon, although the mechanism remains unclear. Certain conditions may need to be applied to ensure a successful plasma etch portion of a hybrid dicing scheme, and to achieve consistent trench width and full thickness etch with good reproducibility over an entire wafer. For example, in one embodiment, for a clean hybrid dicing approach, polymers, dielectric (e.g., oxide) layers and metal layers need to be cleanly removed with minimum residue left in the scribed channel. This approach may expose the maximum available surface area of silicon in the bottom of the scribed trench. Additionally, in one embodiment, the laser aspect should provide consistent scribing kerf width.

In order to achieve the above conditions or requirements for laser scribing, typically multiple-pass scribing techniques are used in which a single beam scans along the scribe line back and forth for multiple passes. The first pass typically removes a majority of material, while the subsequent passes clean the scribed channel to ensure cleanliness along each channel. However, a multiple-pass approach can significantly impact the laser scribing throughput or effective scribing speed (e.g., as equivalent to a single pass scribing speed). For example, if scribing a line at approximately 800 millimeters/second for 2 passes, the effective scribing speed is only approximately 400 millimeters/second.

Since laser scribing speed may need to be matched with the pulse repetition rate of the laser, multiple-pass scribing approaches typically demand higher pulse repetition rates. For example, if the pulse repetition rate of a laser in use is low, the scribing speed is typically reduced in order to generate high spot-to-spot overlap to form a continuous cut line. As with diode pumped solid state (DPSS) lasers, femtosecond lasers may exhibit the same trend where pulse energy decreases with increased pulse repetition rate. The required pulse energy for a laser scribing process may provide an upper limit of applicable pulse repetition rate.

Figure 1:
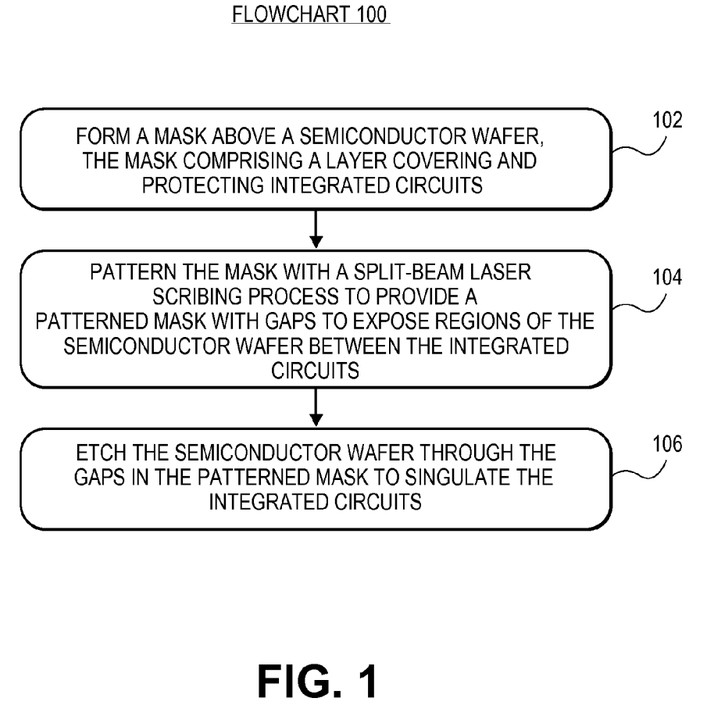
FIG. 1 is a Flowchart representing operations in a method of dicing a semiconductor wafer including a plurality of integrated circuits, in accordance with an embodiment of the present invention.
Figure 2A:
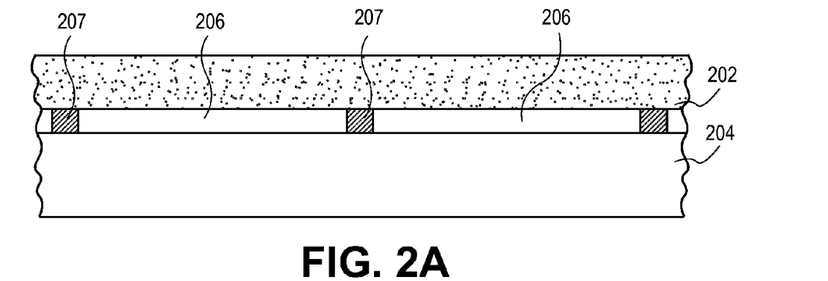
FIG. 2A illustrates a cross-sectional view of a semiconductor wafer including a plurality of integrated circuits during performing of a method of dicing the semiconductor wafer, corresponding to operation 102 of the Flowchart of FIG. 1, in accordance with an embodiment of the present invention.
Figure 2B:
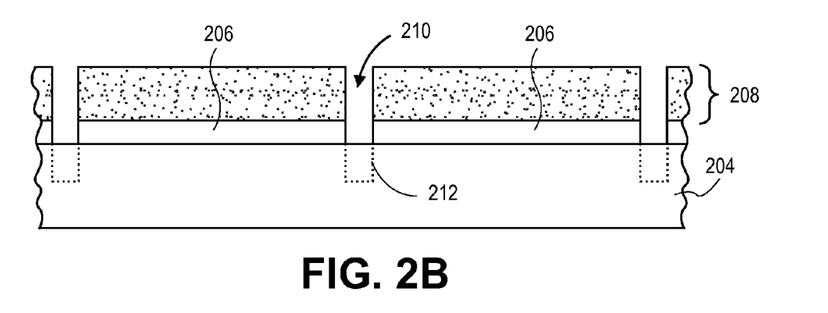
FIG. 2B illustrates a cross-sectional view of a semiconductor wafer including a plurality of integrated circuits during performing of a method of dicing the semiconductor wafer, corresponding to operation 104 of the Flowchart of FIG. 1, in accordance with an embodiment of the present invention.
Figure 2C:
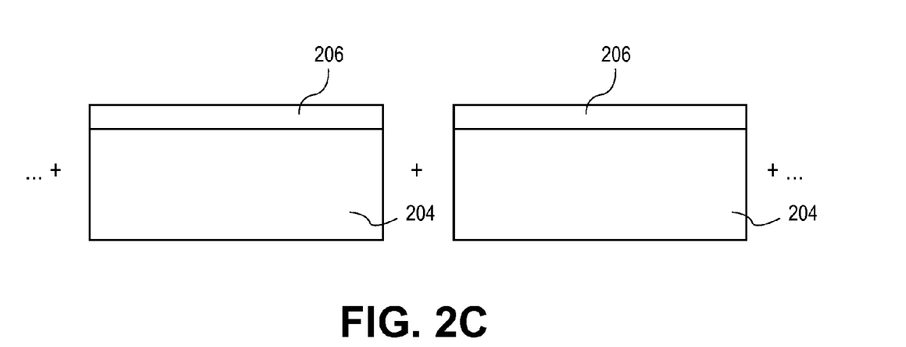
FIG. 2C illustrates a cross-sectional view of a semiconductor wafer including a plurality of integrated circuits during performing of a method of dicing the semiconductor wafer, corresponding to operation 106 of the Flowchart of FIG. 1, in accordance with an embodiment of the present invention.

Thus, in an aspect of the present invention, a combination of a split-beam laser scribing process with a plasma etching process may be used to dice a semiconductor wafer into singulated integrated circuits. FIG. 1 is a Flowchart 100 representing operations in a method of dicing a semiconductor wafer including a plurality of integrated circuits, in accordance with an embodiment of the present invention. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present invention.

Referring to operation 102 of Flowchart 100, and corresponding FIG. 2A, a mask 202 is formed above a semiconductor wafer or substrate 204. The mask 202 is composed of a layer covering and protecting integrated circuits 206 formed on the surface of semiconductor wafer 204. The mask 202 also covers intervening streets 207 formed between each of the integrated circuits 206.

In accordance with an embodiment of the present invention, forming the mask 202 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., a III-V material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

Referring to operation 104 of Flowchart 100, and corresponding FIG. 2B, the mask 202 is patterned with a split-beam laser scribing process to provide a patterned mask 208 with gaps 210, exposing regions of the semiconductor wafer or substrate 204 between the integrated circuits 206. As such, the laser scribing process is used to remove the material of the streets 207 originally formed between the integrated circuits 206. In accordance with an embodiment of the present invention, patterning the mask 202 with the split-beam laser scribing process includes forming trenches 212 partially into the regions of the semiconductor wafer 204 between the integrated circuits 206, as depicted in FIG. 2B. In one embodiment, patterning the mask 202 with the split-beam laser scribing process includes using a laser such as, but not limited to, a nanosecond laser, a picoseconds laser, or a femtosecond laser.

Figure 3:
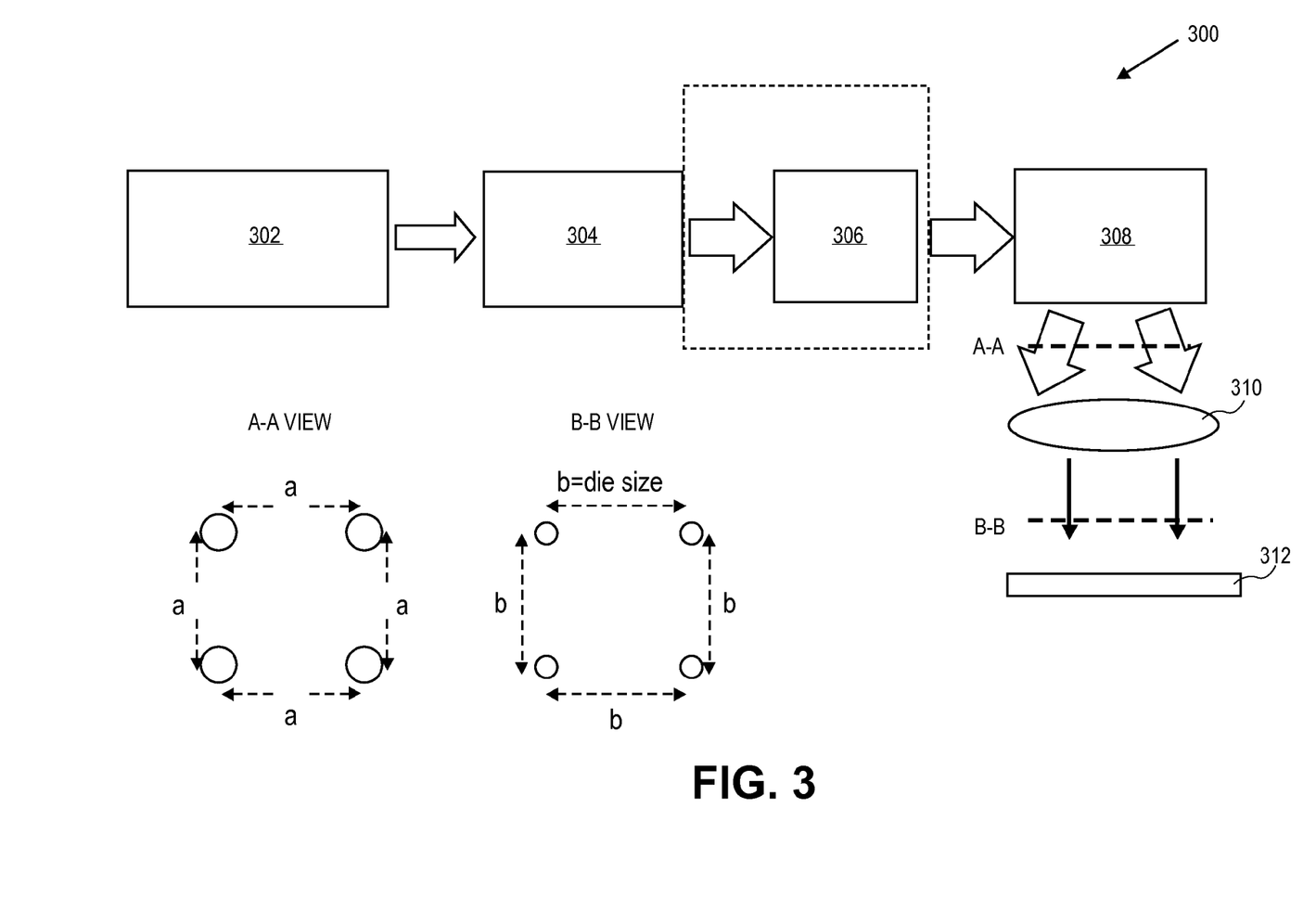
FIG. 3 illustrates a schematic of a split-beam laser scribing process, in accordance with an embodiment of the present invention.

As an example, FIG. 3 illustrates a schematic 300 of a split-beam laser scribing process, in accordance with an embodiment of the present invention. Referring to FIG. 3, a laser 302 provides a beam to a beam expander and collimator 304. Optionally, e.g., in the case that the beam is a Gaussian-shaped beam, the beam may be passed through a Gaussian to top-hat beam shaping module 306. The resulting beam, either from beam expander and collimator 304 or from the Gaussian to top-hat beam shaping module 306, or both, is passed through beam splitting module 308 to provide a split beam. The split beam is passed through a telecentric lens 310 and is used to scribe a work piece 312. Also, shown in FIG. 3 are the A-A view and B-B view indicated in the schematic 300. Also, shown as square patterns in FIG. 3, it is to be understood that the A-A view and B-B view may also be rectangular in pattern.

Figure 4:
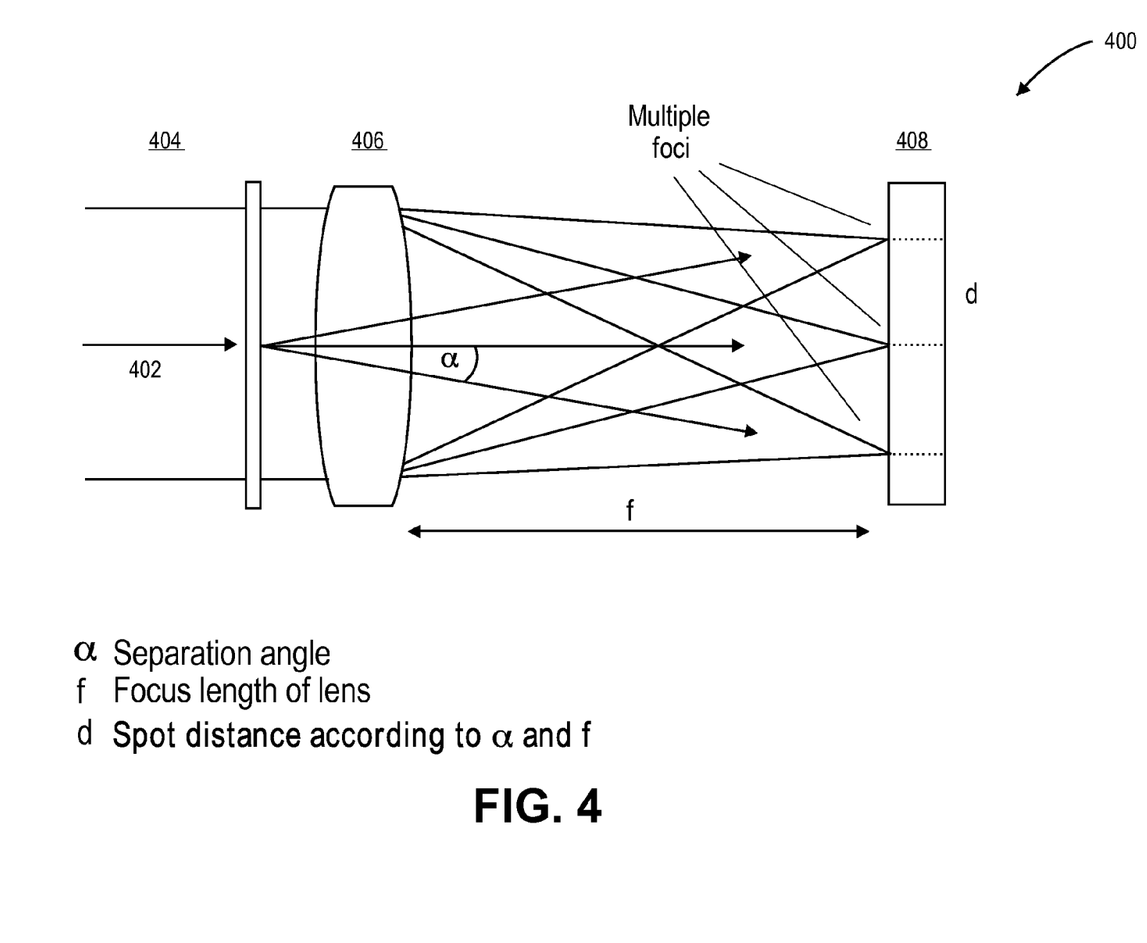
FIG. 4 illustrates a schematic of a beam-splitter, in accordance with an embodiment of the present invention.

As an example, FIG. 4 illustrates a schematic 400 of a beam-splitter, in accordance with an embodiment of the present invention. A diffractive beam splitter operation principal involves an incident laser 402 passed through a diffractive element (DOE) 404. A focusing lens 406 with multiple foci provides multiple beams, points or spots to a working area 408. In one embodiment, a diffractive beam splitter is used to duplicate a master beam into a multiple of beams, which are positioned in a one- or two-dimensional array at well-specified angles. In a specific embodiment, the input diameter equals the output diameter for each duplicated beam.

In accordance with an embodiment of the present invention, an output laser beam of a laser is split via a beam splitting optics module into an M×N (where one or both of M and N is a positive integer equal to or larger than 2) dot matrix pattern. The dot matrix pattern is then focused through a telecentric focal lens to a work surface on which the focused spot-to-spot distance equals to the required dice size for singulation. In one embodiment, the laser is operated at or close to the maximum pulse repetition rate which delivers the required pulse energy at each foci of the M×N dot matrix. In a specific embodiment, where M=N, the laser beam is moved relative to the work piece and a total of N lines are scribed to make (N−1) die singulations in a single pass.

In an embodiment, a diffractive optics element (DOE) is used as a beam splitter. The DOE may retain the divergence angle, profile, diameter and polarization of the input beam. As such, in some embodiments, each split beam may carry the same amount of pulse energy and will deliver nominally equal focal spot and fluence onto a work surface. However, in other embodiments, a beam with non-equal power distribution to split beams is provided. In one embodiment, a telecentric focal lens is used to ensure the incident beam point is delivered perpendicularly onto a work surface since there may exist a non-zero split angle subsequent to splitting the laser beam through, e.g., a diffractive beam splitter.

In an embodiment, a two-dimensional beam splitting divides a single laser beam into N×N beams with pre-specified spacing and beam pattern symmetries. In one such embodiment, a matching telecentric focal lens of appropriate focal length is used to provide the N×N beams to have a pitch equal to the to-be-singulated die size. In a specific embodiment, the laser beam is used in its Gaussian profile. Alternatively, in another specific embodiment, the input beam is first converted into a top hat beam profile through a beam shaping optics module, before it is input to a beam splitting optics apparatus.

In an embodiment, the split-beam approach enables a single-pass, multiple-spot scribing process. In one embodiment, successive multiple-spot ablation ensures clean scribe trench formation consistently across a wafer undergoing singulation. In an embodiment, throughput is significantly improved using such an approach. For example, in a specific embodiment, a laser delivers approximately 45 uJ at approximately 100 kHz, approximately 20 uJ at approximately 200 kHz, approximately 10 uJ at approximately 300 kHz, and approximately 5 uJ at approximately 400 kHz, assuming approximately 5 uJ per beam is needed for scribing a work surface. Assuming approximately 1 micron spot separation may be needed for the scribing process, e.g., while operating the laser at approximately 100 kHz, the scribing speed is approximately 100 millimeters per second (or approximately 200 millimeters per second for scribing at 200 kHz, etc.).

In the above example, a conventional approach may use a single beam of approximately 5 uJ at approximately 400 kHz to scribe at approximately 400 millimeters per second for multiple times, e.g., 2 passes. The equivalent scribing speed per single pass is approximately 200 millimeters per second (=400 millimeters per second/2). By contrast, in one embodiment, a beam is split into 2×2=4 beams with pre-defined spacing, which, at approximately 200 kHz, delivers approximately 5 uJ in each split beam. Using the 2×2 split beams to scribe wafers at approximately 200 millimeters per second in a single pass, two scribed lines are generated at same time. The equivalent scribing speed per single beam is approximately 200 millimeters per second×2=400 millimeters per second, which is double the conventional approach at 400 kHz scribing.

In another embodiment, an input laser beam is split into 3×3=9 beams with pre-defined spacing, which, at approximately 100 kHz, delivers approximately 5 uJ in each split beam. In one such embodiment, the 3×3 split beams are used to scribe wafers at approximately 100 millimeters/second in a single pass, and with three scribed lines generated at same time. The equivalent scribing speed per single beam is approximately 100 millimeters/second times 3, requiring approximately 300 millimeters/second. In one embodiment, a 3×3 split beam is used to provide consistency of cleanliness of scribed trenches.

Thus, in an embodiment, patterning a mask with a split-beam laser scribing process includes splitting a laser beam into an M×N array of points, where one of M or N is greater than 1. In one such embodiment, both M and N are greater than 1. In another such embodiment, all points of the M×N array of points have the same power. In another such embodiment, a first of the points has a different power than a second of the points, e.g., the power-split ratio can differ point to point. In a specific embodiment, M=2 and N=2, and the M×N array of points has a shape such as, but not limited to, a square and a rectangle.

In an embodiment, a split train of laser pulses may be used in reference to operation 104 of Flowchart 100. Depending on the complexity of layers being ablated, a split train of single pulses may not provide optimal energy for ablation performance. However, delivering a greater intensity in a single pulse may lead to defect formation. Instead, in an embodiment, a split train of multiple-pulse bursts is used for the ablation.

In conjunction with the use of split-beam laser scribing, the use of a femtosecond-based laser (versus, e.g., a picoseconds-based laser or a nanosecond-based laser) may be used to further optimize ablation performance of a complex stack of layers undergoing a singulation process. Thus, in an embodiment, patterning the mask 206 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Figure 5:
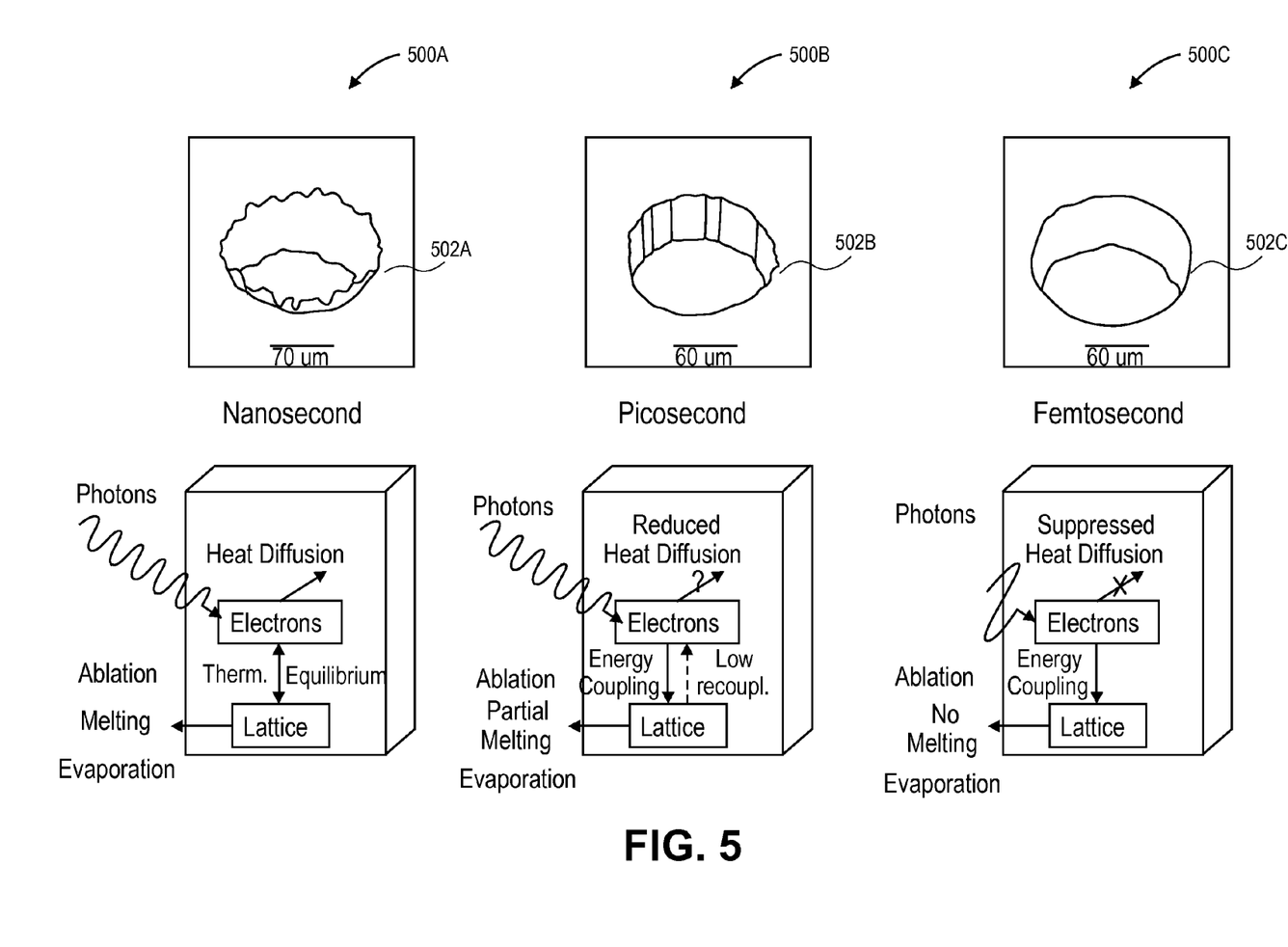
FIG. 5 illustrates the effects of using a laser pulse width in the femtosecond range versus longer pulse widths, in accordance with an embodiment of the present invention.

FIG. 5 illustrates the effects of using a laser pulse width in the femtosecond range versus longer pulse widths, in accordance with an embodiment of the present invention. Referring to FIG. 5, by using a laser pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 6 illustrates a cross-sectional view of a stack of materials that may be used in a street region of a semiconductor wafer or substrate, in accordance with an embodiment of the present invention.

Figure 6:
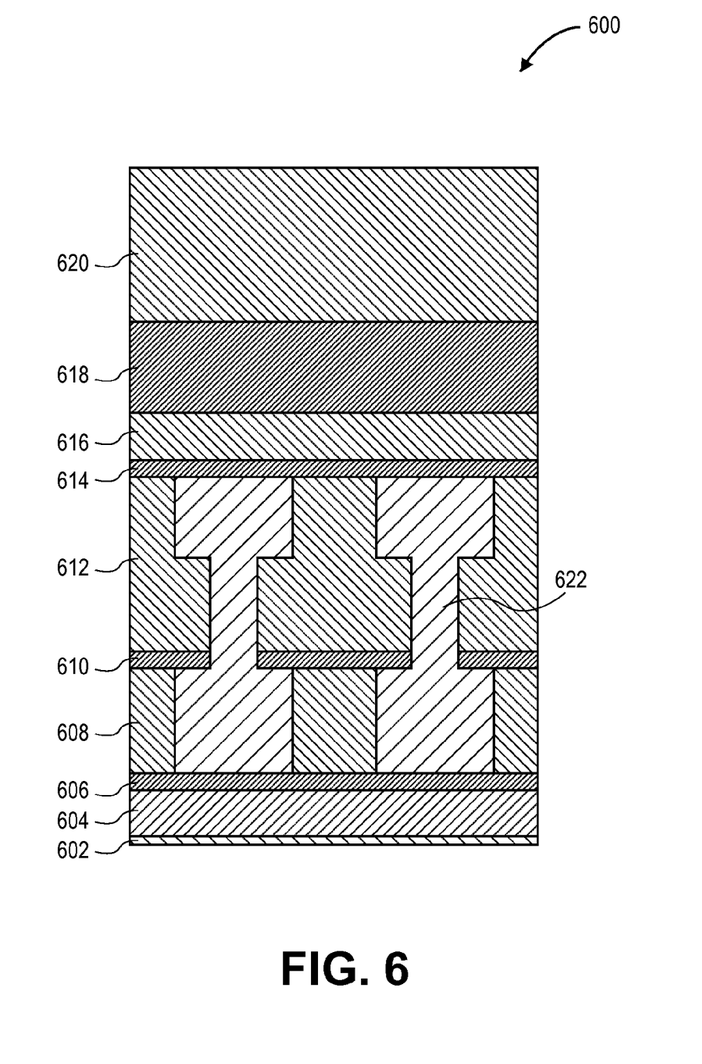
FIG. 6 illustrates a cross-sectional view of a stack of materials that may be used in a street region of a semiconductor wafer or substrate, in accordance with an embodiment of the present invention.

Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, and a layer of photo-resist 620, with relative thicknesses depicted. Copper metallization 622 is disposed between the first and third etch stop layers 606 and 614 and through the second etch stop layer 610. In a specific embodiment, the first, second and third etch stop layers 606, 610 and 614 are composed of silicon nitride, while low K dielectric layers 608 and 612 are composed of a carbon-doped silicon oxide material.

Under conventional laser irradiation (such as nanosecond-based or picosecond-based laser irradiation), the materials of street 600 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, a split-beam laser scribing process is used to pattern a layer of silicon dioxide, a layer of low K material, and a layer of copper with a femtosecond-based laser scribing process by ablating the layer of silicon dioxide prior to ablating the layer of low K material and the layer of copper.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile that is ultimately split may be a single mode (Gaussian) or have a shaped top-hat profile. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 300 mm/sec to 5 m/sec, although preferably approximately in the range of 500 mm/sec to 2 m/sec.

The split-beam scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser may be far more suitable to providing such advantages, as compared with picosecond-based and nanosecond-based laser ablation processes.

However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 106 of Flowchart 100, and corresponding FIG. 2C, the semiconductor wafer 204 is etched through the gaps 210 in the patterned mask 208 to singulate the integrated circuits 206. In accordance with an embodiment of the present invention, etching the semiconductor wafer 204 includes ultimately etching entirely through semiconductor wafer 204, as depicted in FIG. 2C, by etching the trenches 212 initially formed with the split-beam laser scribing process.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_8$, $CHF_3$, $XeF_2$, or any other reactant gas capable of etching silicon at a relatively fast etch rate. In an embodiment, the mask layer 208 is removed after the singulation process, as depicted in FIG. 2C.

Accordingly, referring again to Flowchart 100 and FIGS. 2A-2C, wafer dicing may be preformed by initial ablation using a split-beam laser scribing process to ablate through a mask layer, through wafer streets (including metallization), and partially into a silicon substrate. Die singulation may then be completed by subsequent through-silicon deep plasma etching. A specific example of a materials stack for dicing is described below in association with FIGS. 7A-7D, in accordance with an embodiment of the present invention.

Figure 7A:
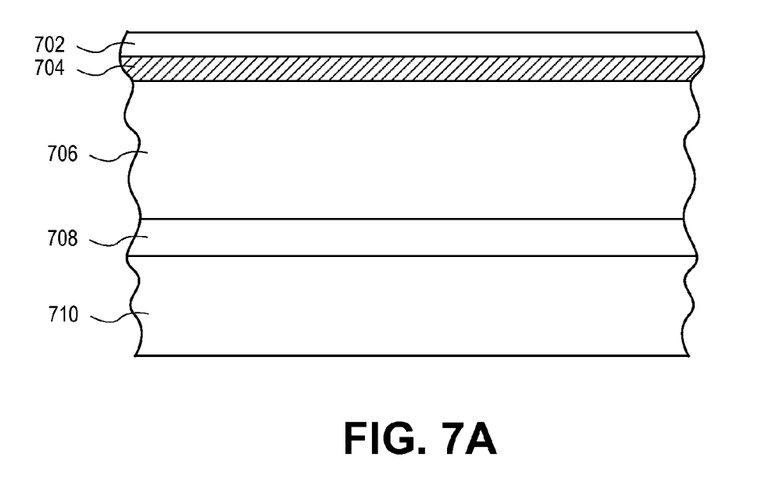
FIGS. 7A-7D illustrate cross-sectional views of various operations in a method of dicing a semiconductor wafer, in accordance with an embodiment of the present invention.

Referring to FIG. 7A, a materials stack for hybrid laser ablation and plasma etch dicing includes a mask layer 702, a device layer 704, and a substrate 706. The mask layer, device layer, and substrate are disposed above a die attach film 708 which is affixed to a backing tape 710. In an embodiment, the mask layer 702 is a photo-resist layer such as the photo-resist layers described above in association with mask 202. The device layer 704 includes an inorganic dielectric layer (such as silicon dioxide) disposed above one or more metal layers (such as copper layers) and one or more low K dielectric layers (such as carbon-doped oxide layers). The device layer 704 also includes streets arranged between integrated circuits, the streets including the same or similar layers to the integrated circuits. The substrate 706 is a bulk single-crystalline silicon substrate.

In an embodiment, the bulk single-crystalline silicon substrate 706 is thinned from the backside prior to being affixed to the die attach film 708. The thinning may be performed by a backside grind process. In one embodiment, the bulk single-crystalline silicon substrate 706 is thinned to a thickness approximately in the range of 50-100 microns. It is important to note that, in an embodiment, the thinning is performed prior to a laser ablation and plasma etch dicing process. In an embodiment, the photo-resist layer 702 has a thickness of approximately 5 microns and the device layer 704 has a thickness approximately in the range of 2-3 microns. In an embodiment, the die attach film 708 (or any suitable substitute capable of bonding a thinned or thin wafer or substrate to the backing tape 710) has a thickness of approximately 20 microns.

Figure 7B:
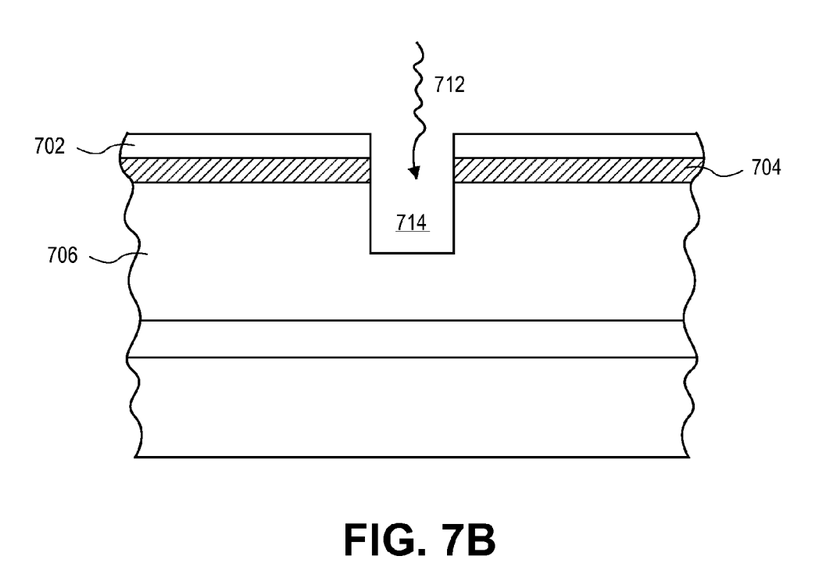
Figure 7C:
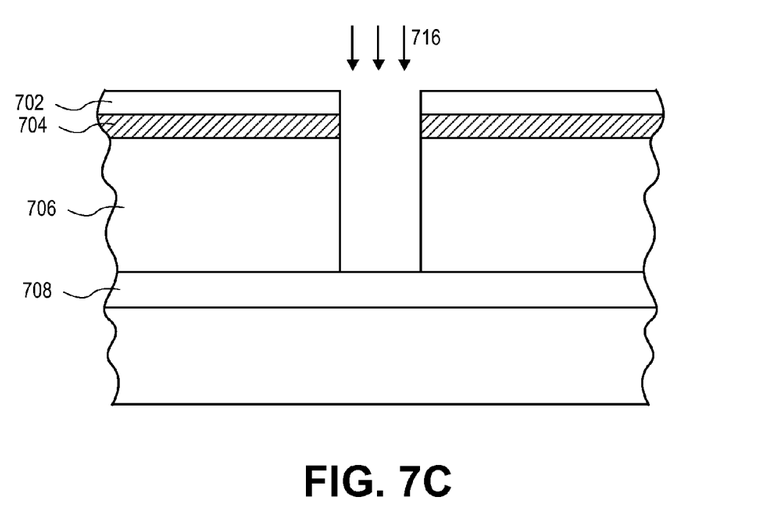

Referring to FIG. 7B, the mask 702, the device layer 704 and a portion of the substrate 706 are patterned with a split-beam laser scribing process 712 to form trenches 714 in the substrate 706. Referring to FIG. 7C, a through-silicon deep plasma etch process 716 is used to extend the trench 714 down to the die attach film 708, exposing the top portion of the die attach film 708 and singulating the silicon substrate 706. The device layer 704 is protected by the photo-resist layer 702 during the through-silicon deep plasma etch process 716.

Figure 7D:
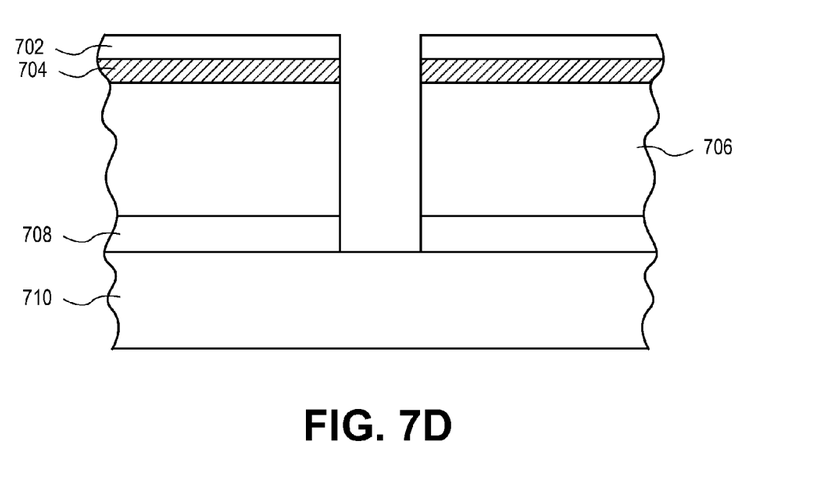

Referring to FIG. 7D, the singulation process may further include patterning the die attach film 708, exposing the top portion of the backing tape 710 and singulating the die attach film 708. In an embodiment, the die attach film is singulated by a laser process or by an etch process. Further embodiments may include subsequently removing the singulated portions of substrate 706 (e.g., as individual integrated circuits) from the backing tape 710. In one embodiment, the singulated die attach film 708 is retained on the back sides of the singulated portions of substrate 706. Other embodiments may include removing the masking photo-resist layer 702 from the device layer 704. In an alternative embodiment, in the case that substrate 706 is thinner than approximately 50 microns, the laser ablation process 712 is used to completely singulate substrate 706 without the use of an additional plasma process.

Subsequent to singulating the die attach film 708, in an embodiment, the masking photo-resist layer 702 is removed from the device layer 704. In an embodiment, the singulated integrated circuits are removed from the backing tape 710 for packaging. In one such embodiment, the patterned die attach film 708 is retained on the backside of each integrated circuit and included in the final packaging. However, in another embodiment, the patterned die attach film 708 is removed during or subsequent to the singulation process.

A single process tool may be configured to perform many or all of the operations in a hybrid laser with split-beam laser ablation and plasma etch singulation process. For example, FIG. 8 illustrates a block diagram of a tool layout for laser and plasma dicing of wafers or substrates, in accordance with an embodiment of the present invention.

Figure 8:
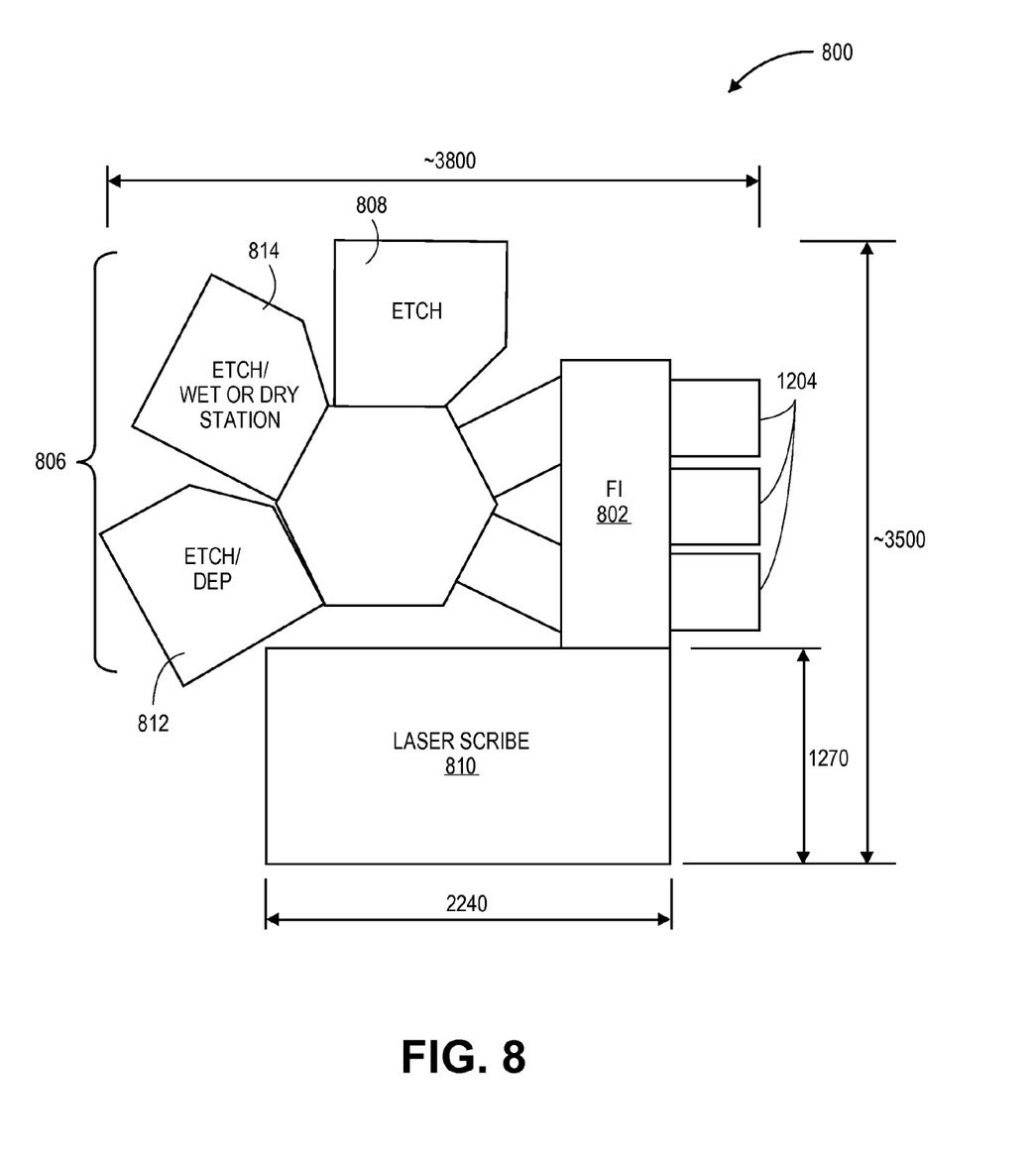
FIG. 8 illustrates a block diagram of a tool layout for laser and plasma dicing of wafers or substrates, in accordance with an embodiment of the present invention.

Referring to FIG. 8, a process tool 800 includes a factory interface 802 (FI) having a plurality of load locks 804 coupled therewith. A cluster tool 806 is coupled with the factory interface 802. The cluster tool 806 includes one or more plasma etch chambers, such as plasma etch chamber 808. A laser scribe apparatus 810 is also coupled to the factory interface 802. The overall footprint of the process tool 800 may be, in one embodiment, approximately 3500 millimeters (3.5 meters) by approximately 3800 millimeters (3.8 meters), as depicted in FIG. 8.

In an embodiment, the laser scribe apparatus 810 houses a laser apparatus configured to perform a split-beam laser scribing process. The laser may be suitable for performing a laser ablation portion of a hybrid laser and etch singulation process, such as the laser ablation processes described above. In one embodiment, a beam splitter is also included in laser scribe apparatus 810. In a specific embodiment, the beam splitter is similar to one of the beam splitters described in association with FIGS. 3 and 4. The overall footprint of the laser scribe apparatus 810 may be, in one embodiment, approximately 2240 millimeters by approximately 1270 millimeters, as depicted in FIG. 8.

In an embodiment, the beam splitter of laser scribe apparatus 810 is configured for splitting a laser beam from the laser into an M×N array of points, where one of M or N is greater than 1. In one such embodiment, both M and N are greater than 1. In another such embodiment, all points of the M×N array of points have the same power. In another such embodiment, a first of the points has a different power than a second of the points. In a specific embodiment, M=2 and N=2, and the M×N array of points has a shape such as, but not limited to, a square or a rectangle.

In an embodiment, the one or more plasma etch chambers 808 is configured for etching a wafer or substrate through the gaps in a patterned mask to singulate a plurality of integrated circuits. In one such embodiment, the one or more plasma etch chambers 808 is configured to perform a deep silicon etch process. In a specific embodiment, the one or more plasma etch chambers 808 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 808 to facilitate high silicon etch rates. In an embodiment, more than one etch chamber is included in the cluster tool 806 portion of process tool 800 to enable high manufacturing throughput of the singulation or dicing process.

The factory interface 802 may be a suitable atmospheric port to interface between an outside manufacturing facility with laser scribe apparatus 810 and cluster tool 806. The factory interface 802 may include robots with arms or blades for transferring wafers (or carriers thereof) from storage units (such as front opening unified pods) into either cluster tool 806 or laser scribe apparatus 810, or both.

Cluster tool 806 may include other chambers suitable for performing functions in a method of singulation. For example, in one embodiment, in place of an additional etch chamber, a deposition chamber 812 is included. The deposition chamber 812 may be configured for mask deposition on or above a device layer of a wafer or substrate prior to laser scribing of the wafer or substrate. In one such embodiment, the deposition chamber 812 is suitable for depositing a photo-resist layer. In another embodiment, in place of an additional etch chamber, a wet/dry station 814 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 800.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 800 described in association with FIG. 8. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
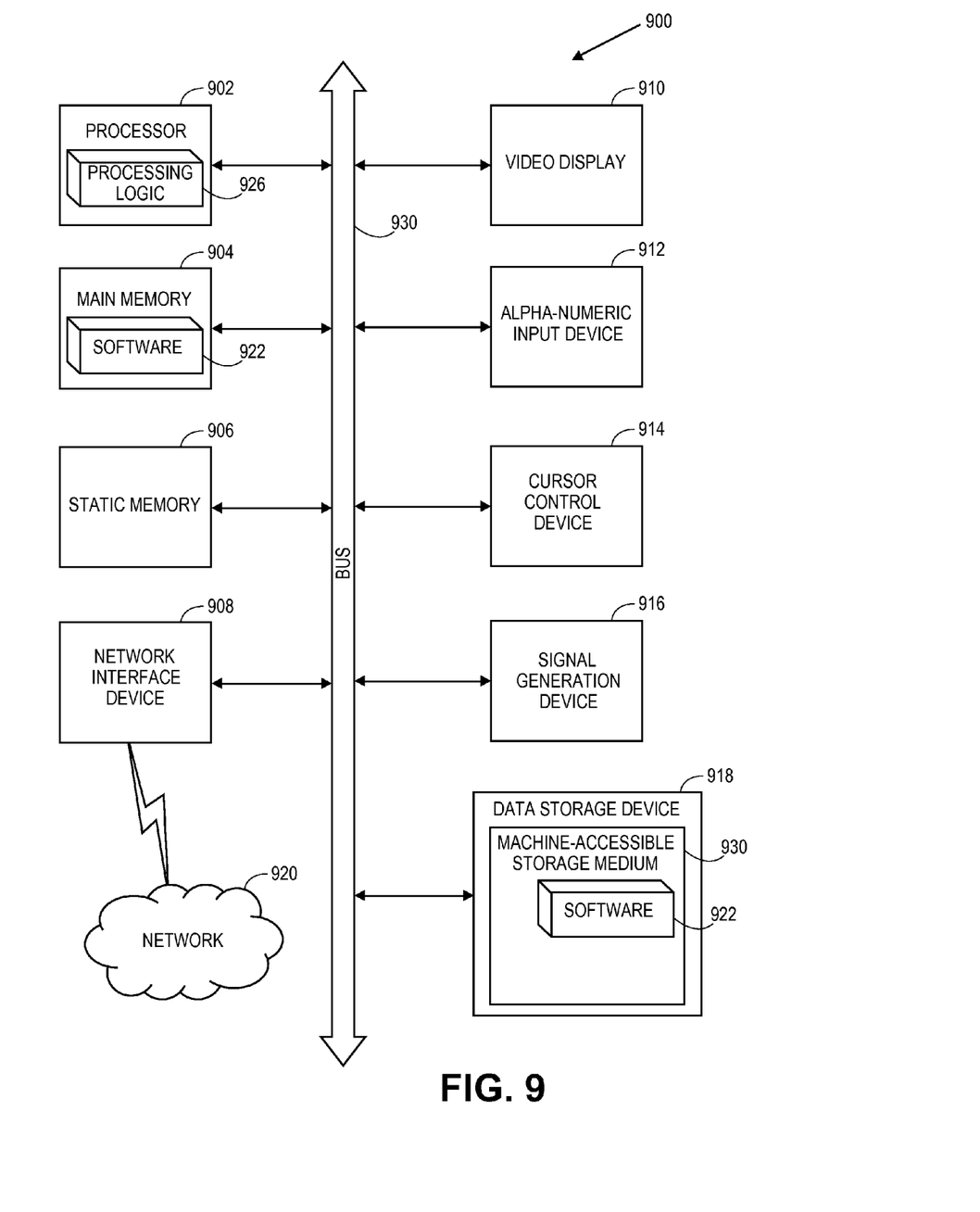
FIG. 9 illustrates a block diagram of an exemplary computer system, in accordance with an embodiment of the present invention.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 931 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The mask is then patterned with a split-beam laser scribing process to provide a patterned mask with gaps. Regions of the semiconductor wafer are exposed between the integrated circuits. The semiconductor wafer is then etched through the gaps in the patterned mask to singulate the integrated circuits.

Thus, methods of dicing semiconductor wafers, each wafer having a plurality of integrated circuits, have been disclosed. In accordance with an embodiment of the present invention, a method includes dicing a semiconductor wafer having a plurality of integrated circuits includes forming a mask above the semiconductor wafer, the mask composed of a layer covering and protecting the integrated circuits. The method also includes patterning the mask with a split-beam laser scribing process to provide a patterned mask with gaps, exposing regions of the semiconductor wafer between the integrated circuits. The method also includes etching the semiconductor wafer through the gaps in the patterned mask to singulate the integrated circuits. In one embodiment, patterning the mask with the split-beam laser scribing process includes splitting a laser beam into an M×N array of points, where one of M or N is greater than 1. In one embodiment, patterning the mask with the split-beam laser scribing process includes using a femtosecond-based laser.

What is claimed is:

1. A method of dicing a semiconductor wafer comprising a front surface having a plurality of integrated circuits thereon and having a back surface opposite the front surface, the method comprising:

forming a mask on the front surface of the semiconductor wafer, the mask comprising a layer covering and protecting the integrated circuits;

patterning the mask and a portion of the semiconductor wafer with a split-beam laser scribing process to provide a patterned mask and to form trenches partially into but not through the semiconductor wafer between the integrated circuits, each of the trenches having an opening in the semiconductor wafer, the opening in the semiconductor wafer having a width; and plasma etching, with the patterned mask exposed, the semiconductor wafer through the trenches to form corresponding trench extensions and to singulate the integrated circuits, each of the corresponding trench extensions having the width.

2. The method of claim 1, wherein patterning the mask and the portion of the semiconductor wafer with the split-beam laser scribing process comprises splitting a laser beam into an M×N array of points, where one of M or N is greater than 1.

3. The method of claim 2, wherein both M and N are greater than 1.

4. The method of claim 2, wherein all points of the M×N array of points have the same power.

5. The method of claim 2, wherein a first of the points has a different power than a second of the points.

6. The method of claim 3, wherein M=2 and N=2, and the M×N array of points has a shape selected from the group consisting of a square and a rectangle.

7. The method of claim 1, wherein patterning the mask and the portion of the semiconductor wafer with the split-beam laser scribing process comprises using a femtosecond-based laser.

8. A method of dicing a semiconductor wafer comprising a front surface having a plurality of integrated circuits thereon and having a back surface opposite the front surface, the method comprising:

forming a mask on the front surface of the semiconductor wafer, the mask comprising a layer covering and protecting the integrated circuits;

patterning the mask and a portion of the semiconductor wafer with a split-beam laser scribing process to provide a patterned mask and to form trenches partially into but not through the semiconductor wafer between the integrated circuits, each of the trenches having an opening in the semiconductor wafer, the opening in the semiconductor wafer having a width, wherein the split-beam laser scribing process comprises splitting a laser beam into an M×N array of points, wherein both M and N are greater than 1; and singulating, with the patterned mask exposed, the integrated circuits through the trenches to form corresponding trench extensions using a process different from the split-beam laser scribing process, each of the corresponding trench extensions having the width.

9. The method of claim 8, wherein all points of the M×N array of points have the same power.

10. The method of claim 8, wherein a first of the points has a different power than a second of the points.

11. The method of claim 8, wherein M=2 and N=2, and the M×N array of points has a shape selected from the group consisting of a square and a rectangle.

12. The method of claim 8, wherein patterning the mask and the portion of the semiconductor wafer with the split-beam laser scribing process comprises using a femtosecond-based laser.

* * * * *